United States Patent
Huang et al.

(10) Patent No.: US 11,134,579 B2
(45) Date of Patent: Sep. 28, 2021

(54) HINGE MODULE AND ELECTRONIC DEVICE

(71) Applicant: Acer Incorporated, New Taipei (TW)

(72) Inventors: Yi-Ta Huang, New Taipei (TW); Cheng-Nan Ling, New Taipei (TW); Wu-Chen Lee, New Taipei (TW)

(73) Assignee: Acer Incorporated, New Taipei (TW)

( * ) Notice: Subject to any disclaimer, the term of this patent is extended or adjusted under 35 U.S.C. 154(b) by 6 days.

(21) Appl. No.: 16/713,002

(22) Filed: Dec. 13, 2019

(65) Prior Publication Data

US 2020/0329573 A1  Oct. 15, 2020

(30) Foreign Application Priority Data

Apr. 12, 2019 (TW) ................. 108204471

(51) Int. Cl.
| | |
|---|---|
| *G06F 1/16* | (2006.01) |
| *H05K 5/02* | (2006.01) |
| *H05K 5/00* | (2006.01) |
| *E05D 3/12* | (2006.01) |

(52) U.S. Cl.
CPC ......... *H05K 5/0226* (2013.01); *G06F 1/1652* (2013.01); *G06F 1/1681* (2013.01); *H05K 5/0017* (2013.01); *E05D 3/122* (2013.01); *E05Y 2900/606* (2013.01)

(58) Field of Classification Search
CPC ... G06F 1/1652; G06F 1/1681; H04M 1/0268
See application file for complete search history.

(56) References Cited

U.S. PATENT DOCUMENTS

| | | | |
|---|---|---|---|
| 6,377,324 B1* | 4/2002 | Katsura | G02F 1/133305 349/58 |
| 6,577,496 B1* | 6/2003 | Gioscia | G06F 1/1616 345/156 |
| 8,804,349 B2* | 8/2014 | Lee | H04M 1/0268 361/749 |
| 9,507,388 B1 | 11/2016 | Hampton et al. | |
| 9,677,308 B1 | 6/2017 | Chen et al. | |
| 9,870,031 B2* | 1/2018 | Hsu | G06F 1/1681 |
| 10,423,019 B1* | 9/2019 | Song | G06F 1/1652 |
| 10,599,189 B1* | 3/2020 | Hsu | G06F 1/1681 |
| 2006/0050169 A1* | 3/2006 | Misawa | G06F 1/1616 348/333.06 |
| 2012/0236484 A1* | 9/2012 | Miyake | G06F 1/1616 361/679.01 |

(Continued)

FOREIGN PATENT DOCUMENTS

CN        2864782        1/2007

OTHER PUBLICATIONS

"Search Report of Europe Counterpart Application", dated Sep. 11, 2020, p. 1-p. 7.

*Primary Examiner* — Adrian S Wilson
(74) *Attorney, Agent, or Firm* — JCIPRNET

(57) ABSTRACT

A hinge module including a first hinge having a first gear, a second hinge having a second gear, and a gear rack is provided. The first and second gears are movably coupled to the gear rack. The first hinge moves on the gear rack via rotation of the first gear, the second hinge moves on the gear rack via rotation of the second gear, and the first hinge and the second hinge move closer or away from each other via rotation. An electronic device is also provided.

19 Claims, 9 Drawing Sheets

(56) References Cited

U.S. PATENT DOCUMENTS

| | | | | |
|---|---|---|---|---|
| 2012/0307423 A1* | 12/2012 | Bohn | .................... | G06F 1/1652 |
| | | | | 361/679.01 |
| 2015/0173218 A1* | 6/2015 | Hsu | ...................... | G06F 1/1618 |
| | | | | 16/366 |
| 2015/0241925 A1* | 8/2015 | Seo | ...................... | G06F 1/1681 |
| | | | | 361/679.27 |
| 2016/0227645 A1 | 8/2016 | Hampton et al. | | |
| 2020/0326757 A1* | 10/2020 | Huang | ................. | G06F 1/1616 |

* cited by examiner

HINGE MODULE AND ELECTRONIC DEVICE

CROSS-REFERENCE TO RELATED APPLICATION

This application claims the priority benefit of Taiwan application serial no. 108204471, filed on Apr. 12, 2019. The entirety of the above-mentioned patent application is hereby incorporated by reference herein and made a part of this specification.

BACKGROUND

Technical Field

The disclosure relates to a hinge module and an electronic device.

Description of Related Art

With the advancement of technology, the flexible display technology is gradually maturing and considered to have a strong developmental potential. In general, the flexible display technology includes electronic paper, flexible organic light-emitting diode (OLED), etc. Furthermore, in view of functional requirements such as bending, folding, extending, etc. of the display device for portable electronic device, the application of flexible display technology on portable electronic device is very diverse. At the same time, with the application of flexible material in the field of electronic display, the electronic display device may not only be displayed in a larger area when extended, but may also be folded when required to facilitate portability.

However, corresponding to the extending and folding of device mechanism on the flexible display device, a flexible (soft) display panel on the flexible display device also correspondingly changes in shape and size due to the flexible characteristic thereof. For example, the flexible display panel may have an extra or a reduced length relative to the device mechanism due to difference in degrees of bending (flattening). If the design is performed with mechanical characteristics of existing electronic device, it will not only cause inconvenience in use, but may also cause the display panel to deviate from the original position, thereby resulting in creasing or even falling off from the mechanism. Therefore, there is an urgent need in the field to improve on the mechanism of existing flexible display device, so as to adapt to the trend in technology development and market demands.

SUMMARY

The disclosure provides a hinge module and an electronic device to meet the opening and closing requirements of a flexible display.

The hinge module of the disclosure includes a first hinge, a second hinge, and a gear rack. The first hinge has a first gear and the second hinge has a second gear. The first gear and the second gear are movably coupled to the gear rack. The first hinge moves on the gear rack via rotation of the first gear, the second hinge moves on the gear rack via rotation of the second gear, and the first hinge and the second hinge move closer to or away from each other via rotation.

The electronic device of the disclosure includes a flexible display and a hinge module. The flexible display is partially connected to the hinge module, so as to be driven by rotation of the hinge module to switch between a bent state and a flat state. The hinge module includes a first hinge, a second hinge, and a gear rack. The first hinge has a first gear and the second hinge has a second gear. The first gear and the second gear are movably coupled to the gear rack. The first hinge moves on the gear rack via rotation of the first gear, the second hinge moves on the gear rack via rotation of the second gear, and the first hinge and the second hinge move closer to or away from each other via rotation. When the flexible display is in the bent state, the first hinge and the second hinge are away from each other. During the process of the flexible display switching from the bent state to the flat state, the first hinge and the second hinge move closer to each other to support the flexible display on a plane together.

Based on the above, the electronic device is configured with the hinge module to correspond to the flexible characteristic of the flexible display, so that the first hinge and the second hinge of the hinge module may move closer to or away from each other during the process of rotation, so as to conform with the deformation trend of the flexible display.

The hinge module allows the first gear and the second gear to be movably coupled to the gear rack together via the first gear and the second gear synchronously rotating with the first hinge and the second hinge respectively, so that a relative displacement exists between the first gear and the second gear during the rotating process. In this way, when the flexible display is in the bent state, the first hinge and the second hinge are away from each other, so that the bending of the flexible display may be accommodated between the first hinge and the second hinge. During the process of the flexible display switching from the bent state to the flat state, the first hinge and the second hinge move closer to each other to cope with the increased size of the bending after being flattened, so that the flexible display may still be stably supported by the first hinge and the second hinge on a plane together in the flat state.

To make the aforementioned and other features of the disclosure more comprehensible, several embodiments accompanied with drawings are described in detail as follows.

DETAILED DESCRIPTION OF DISCLOSED EMBODIMENTS

Figure 1A:
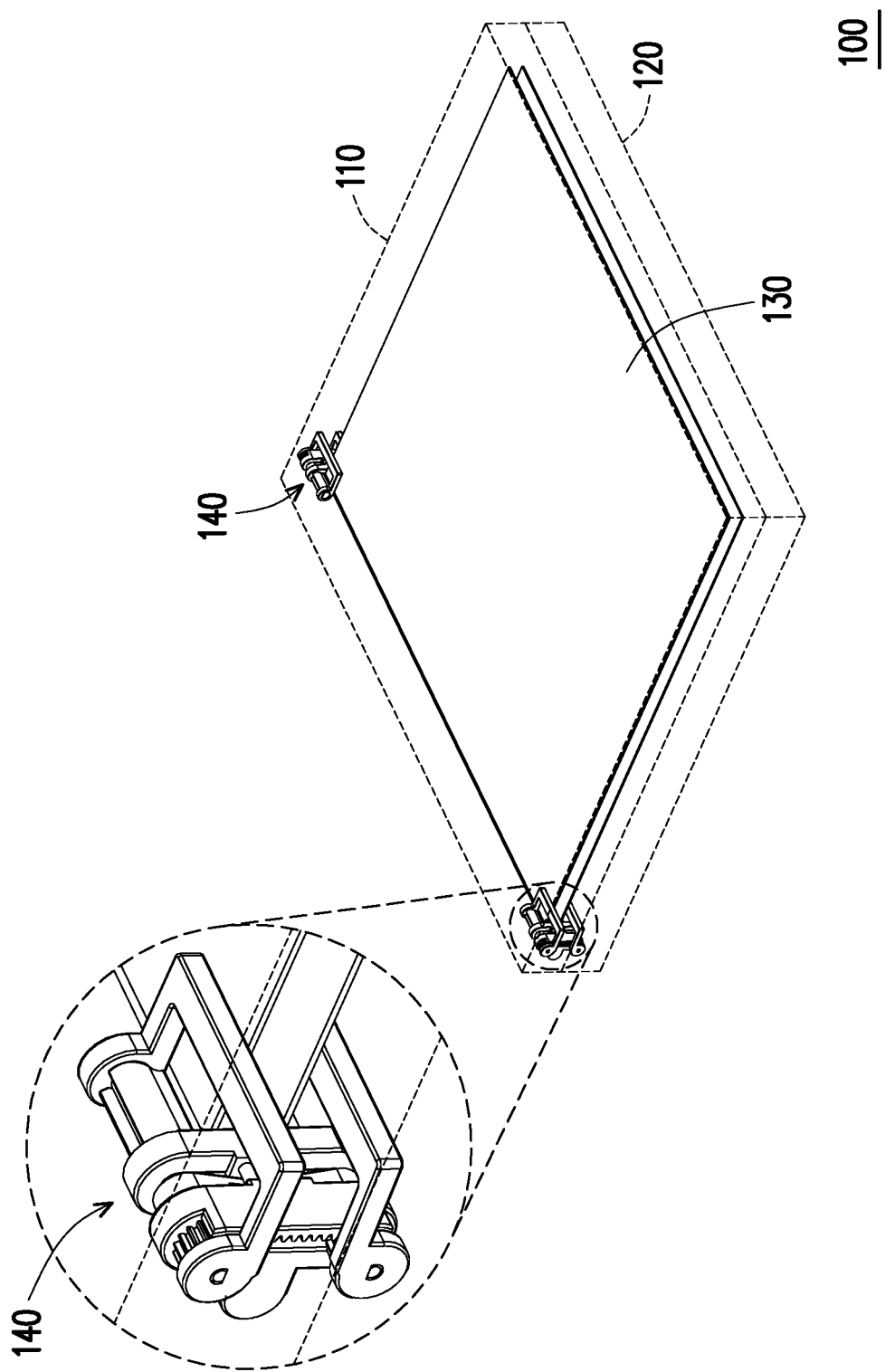
FIG. 1A is a schematic view of an electronic device in accordance with an embodiment of the disclosure.
Figure 1B:
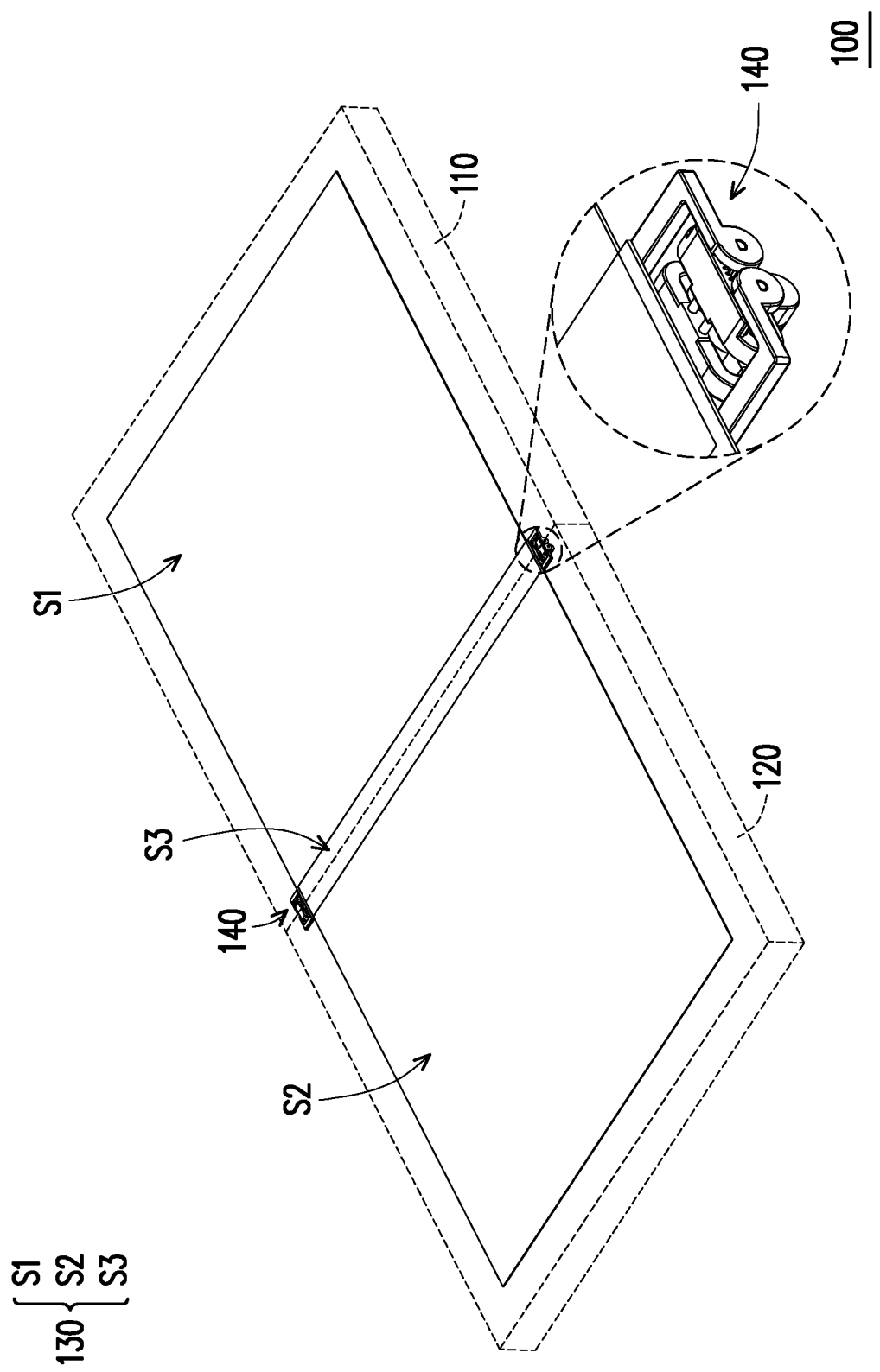
FIG. 1B is a schematic view of the electronic device of FIG. 1A in another state.

FIG. 1A is a schematic view of an electronic device in accordance with an embodiment of the disclosure. FIG. 1B is a schematic view of the electronic device of FIG. 1A in another state. Referring to FIG. 1A and FIG. 1B at the same time, in the embodiment, an electronic device 100 is, for example, a portable electronic device such as a handphone, a tablet computer, or a notebook computer, which includes a first body 110, a second body 120, a hinge module 140, and a flexible display 130. The first body 110 and the second body 120 are pivoted together via the hinge module 140, so that the first body 110 and the second body 120 may relatively rotate to be folded or unfolded via the hinge module 140. Moreover, since the electronic device 100 is also configured with the flexible display 130, the flexible display 130 may also be switched between a bent state (for example, FIG. 1A) and a flat state (for example, FIG. 1B) like opening and closing a book as the first body 110 and the second body 120 are rotated relatively, thereby facilitating portability and applicability of the electronic device 100, and simultaneously improving ease of operation.

As mentioned above, the flexible characteristic of the flexible display 130 vary in shape and size due to different states thereof. In order for the mechanism route of the device (for example, the first body 110 or the second body 120) to conform with the amount of deformation of the flexible display 130, the embodiment achieves the requirement by providing a hinge mechanism capable of moving relatively.

Figure 2A:
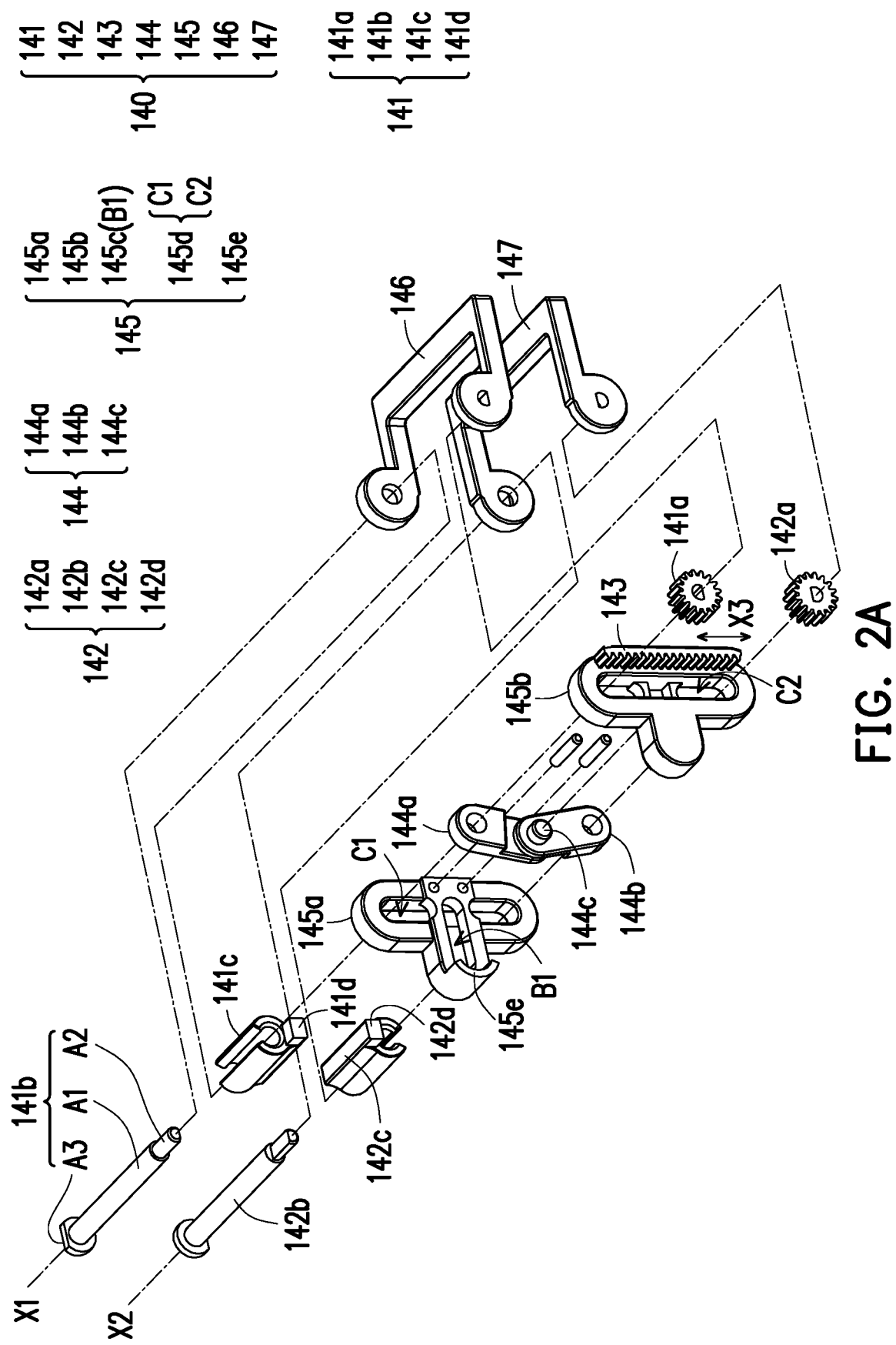
FIG. 2A and FIG. 2B are exploded views of a hinge module from different perspectives respectively.
Figure 2B:
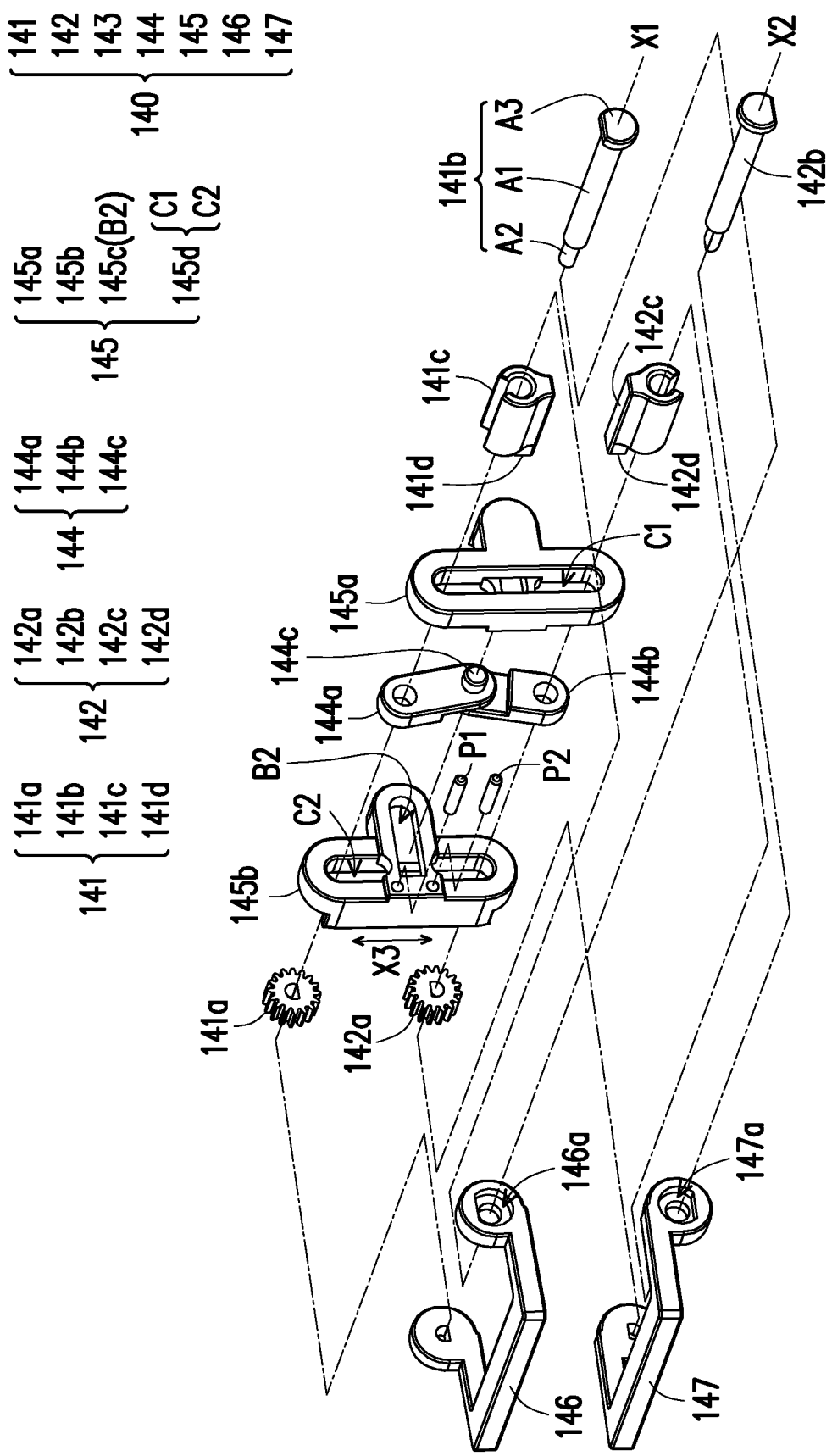

FIG. 2A and FIG. 2B are exploded views of a hinge module from different perspectives respectively. Referring to FIG. 1A, FIG. 2A, and FIG. 2B at the same time, in the embodiment, the hinge module 140 includes a first hinge 141, a second hinge 142, a gear rack 143, a linkage 144, a stand 145, and a pair of cradles 146 and 147, wherein the cradle 146 is assembled to the first body 110 and partially connected to the flexible display 130, the first hinge 141 passes through the stand 145 and the linkage 144 and is assembled to the cradle 146, the cradle 147 is assembled to the second body 120 and partially connected to the flexible display 130, and the second hinge 142 passes through the stand 145 and the linkage 144 and is assembled to the cradle 147.

In detail, the first hinge 141 of the embodiment includes a first shaft portion 141b, a first gear 141a, and a first torsion member 141c. The first shaft portion 141b is divided into different sections A1, A2, and A3. The first shaft portion 141b passes through the first torsion member 141c and is assembled to the first gear 141a, wherein the section A2 and the first gear 141a are fixed via a D-shaped structure and a D-shaped hole, and the section A3 and a depression 146a of the cradle 146 are also fixed via a similar D-shaped structure and a similar D-shaped hole. When the first body 110 is pivoted, the first body 110 and the cradle 146 synchronously rotate with the first shaft portion 141b and the first gear 141a. Also, the first shaft portion 141b allows the first torsion member 141c to provide the required torsion via rotating relative to the first torsion member 141c.

Similarly, the second hinge 142 of the embodiment includes a second shaft portion 142b, a second gear 142a, and a second torsion member 142c. The second hinge 142 exhibits the same configuration and action as the first hinge 141. For example, the second hinge 142 is also fixed with a depression 147a of the cradle 147 by the section A3, so that the cradle 147 may synchronously rotate with the second shaft portion 142b and the second shaft portion 142b may obtain the required torsion via rotating relative to the second torsion member 142c. It should be noted that the first torsion member 141c and the second torsion member 142c are same as the hinge structure of conventional technology, and shall not be reiterated.

It should be noted that the first gear 141a and the second gear 142a of the embodiment are movably coupled to the gear rack 143, wherein the first hinge 141 moves on the rack 143 via rotation of the first gear 141a and the second hinge 142 moves on the rack 143 via rotation of the second gear 142a. Since the rotation directions of the first hinge 141 and the second hinge 142 are opposite to each other during the unfolding and folding of the electronic device 100, the first hinge 141 and the second hinge 142 may move closer to or away from each other on the gear rack 143 via rotation.

Referring again to FIG. 2A and FIG. 2B, the stand 145 includes components 145a and 145b (which are combined together via support pillars P1 and P2) butted to each other. The first shaft portion 141b and the second shaft portion 142b movably pass through a second track 145d of the components 145a and 145b. The second track 145d is substantially constituted by a reaming groove C1 of the component 145a and a reaming groove C2 of the component 145b. Therefore, the second track 145d restricts movable directions of the first shaft portion 141b and the second shaft portion 142b. As shown in FIG. 2A and FIG. 2B, the first hinge 141 and the first gear 141a thereof rotate about a first axis X1, and the second hinge 142 and the second gear 142a thereof rotate about a second axis X2. Since the extending direction of the axis (a third axis X3) of the gear rack 143 is consistent with the extending direction of the axis (the third axis X3) of the second track 145d, the first hinge 141 and the second hinge 142 relatively move closer to or away from each other on the gear rack 143 along the third axis X3. Here, the first axis X1 is parallel to the second axis X2 and the third axis X3 is orthogonal to the first axis X1 and the second axis X2. In addition, the first torsion member 141c and the second torsion member 142c of the embodiment respectively have protruding portions 141d and 142d. The protruding portions 141d and 142d are respectively coupled to the reaming groove C1, so that the first hinge 141 and the second hinge 142 are able to move along the second track 145d.

In the embodiment, the gear rack 143 and the stand 145 are an integral structure, but the embodiment is not limited herein.

In addition, the linkage 144 is connected to the first hinge 141 and the second hinge 142 to synchronously move the first hinge 141 and the second hinge 142. In detail, the linkage 144 includes a first rod 144a, a second rod 144b, and a pivoting shaft 144c. The first rod 144a is connected to the first shaft portion 141b of the first hinge 141 and the second rod 144b is connected to the second shaft portion 142b of the second hinge 142. The pivoting shaft 144c pivots the first rod 144a and the second rod 144b, and is movably coupled to a first track 145c of the stand 145. Referring to the first track 145c shown in FIG. 2A and FIG. 2B at the same time, the first track 145c is distributed in a reaming groove B1 on the component 145a and the reaming groove B2 on the component 145b due to different perspectives. Also, the opposite ends of the pivot shaft 144c are movably pivoted to the reaming grooves B1 and B2 respectively, and the size (length) of the first rod 144a is substantially equal to the size (length) of the second rod 144b such that the movement routes of the two rods are consistent. Accordingly, the linkage 144 connects and synchronizes the first hinge 141 and the second hinge 142 to ensure that the movement routes of the first hinge 141 and the second hinge 142 on the gear rack 143 are consistent although the pivoting directions and the moving directions thereof are opposite. Here, a local structure of the first track 145c is located on the second track 145d, that is, on the moving paths of the first hinge 141 and the second hinge 142, thereby providing a stopping effect.

Figure 3A:
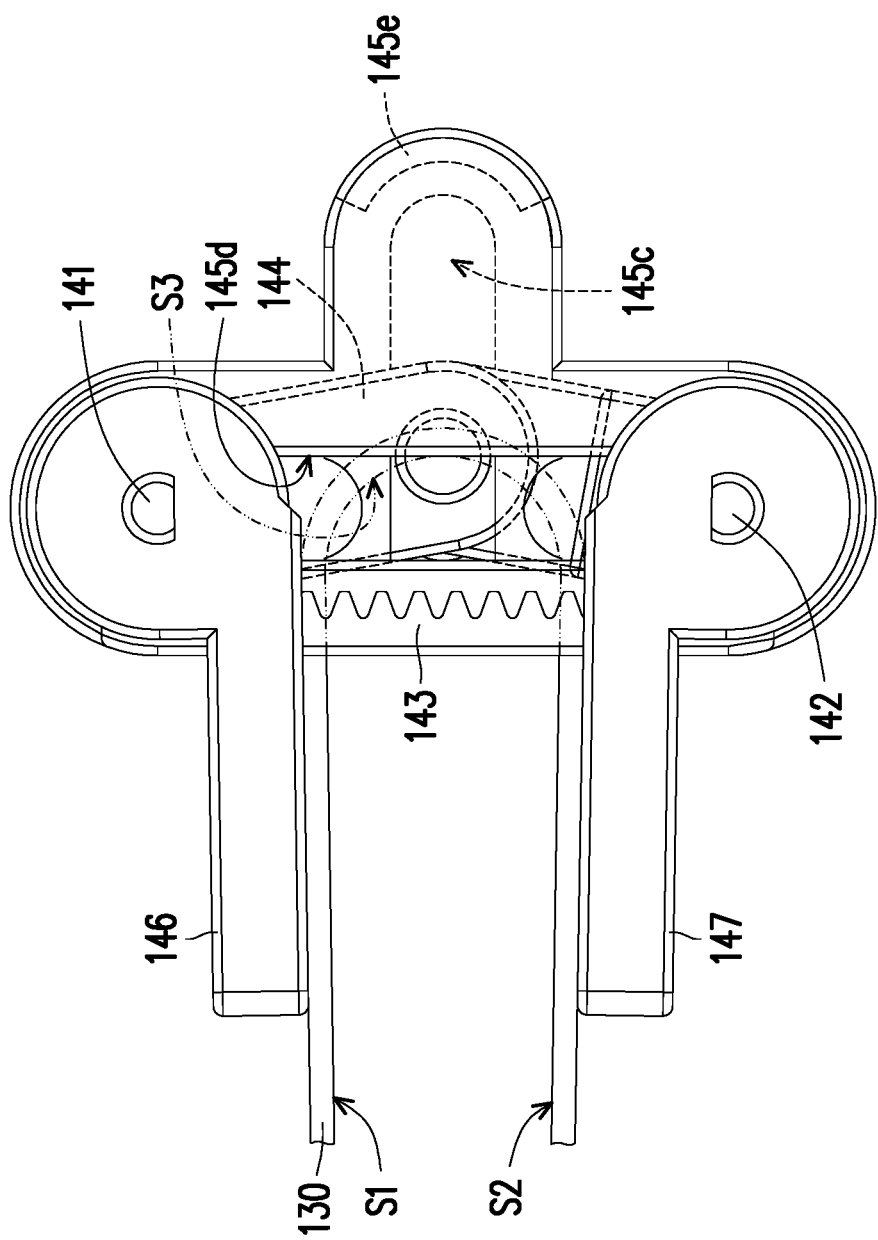
FIG. 3A to FIG. 3C are partial side views of an electronic device in different states.
Figure 3B:
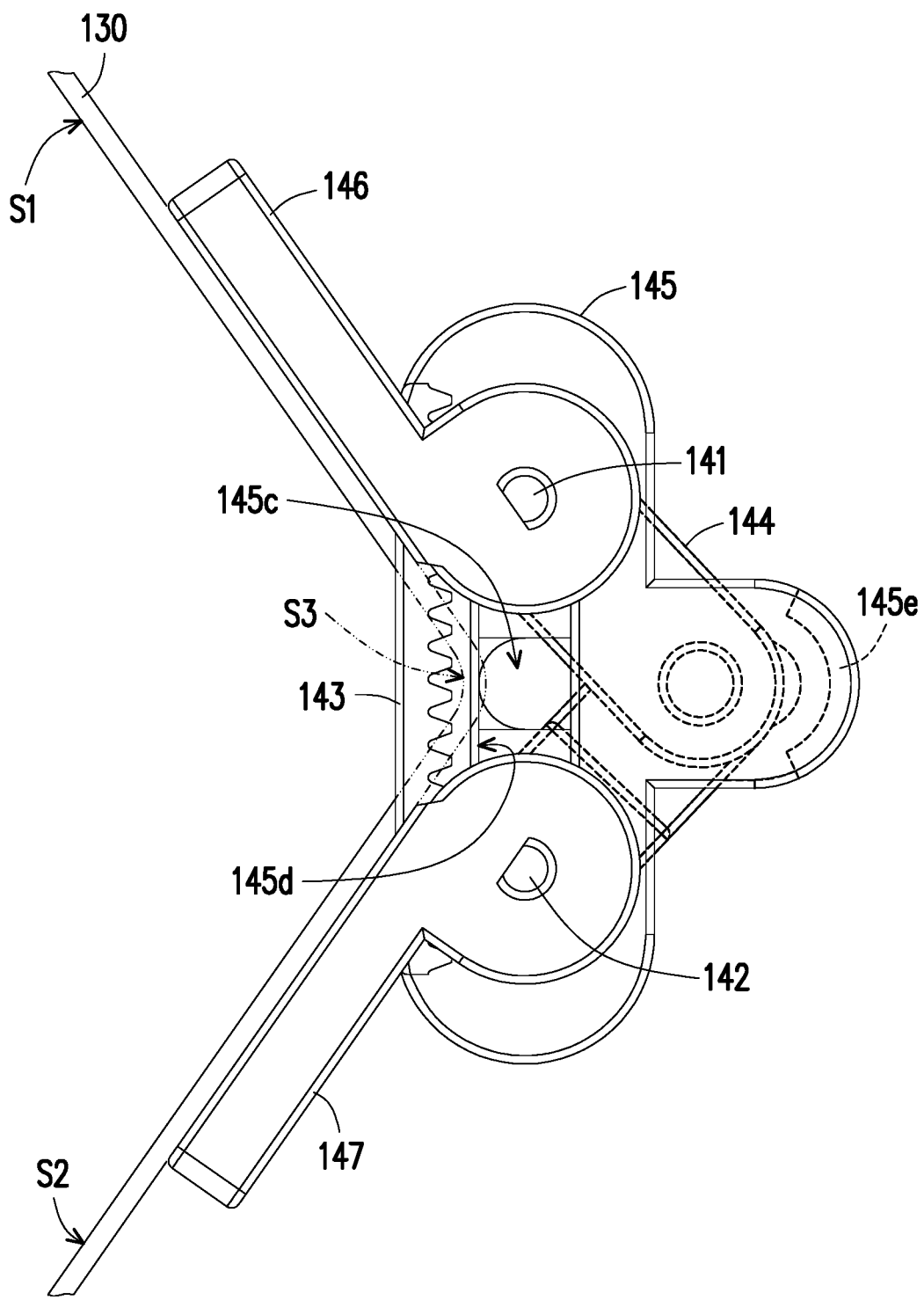
Figure 3C:
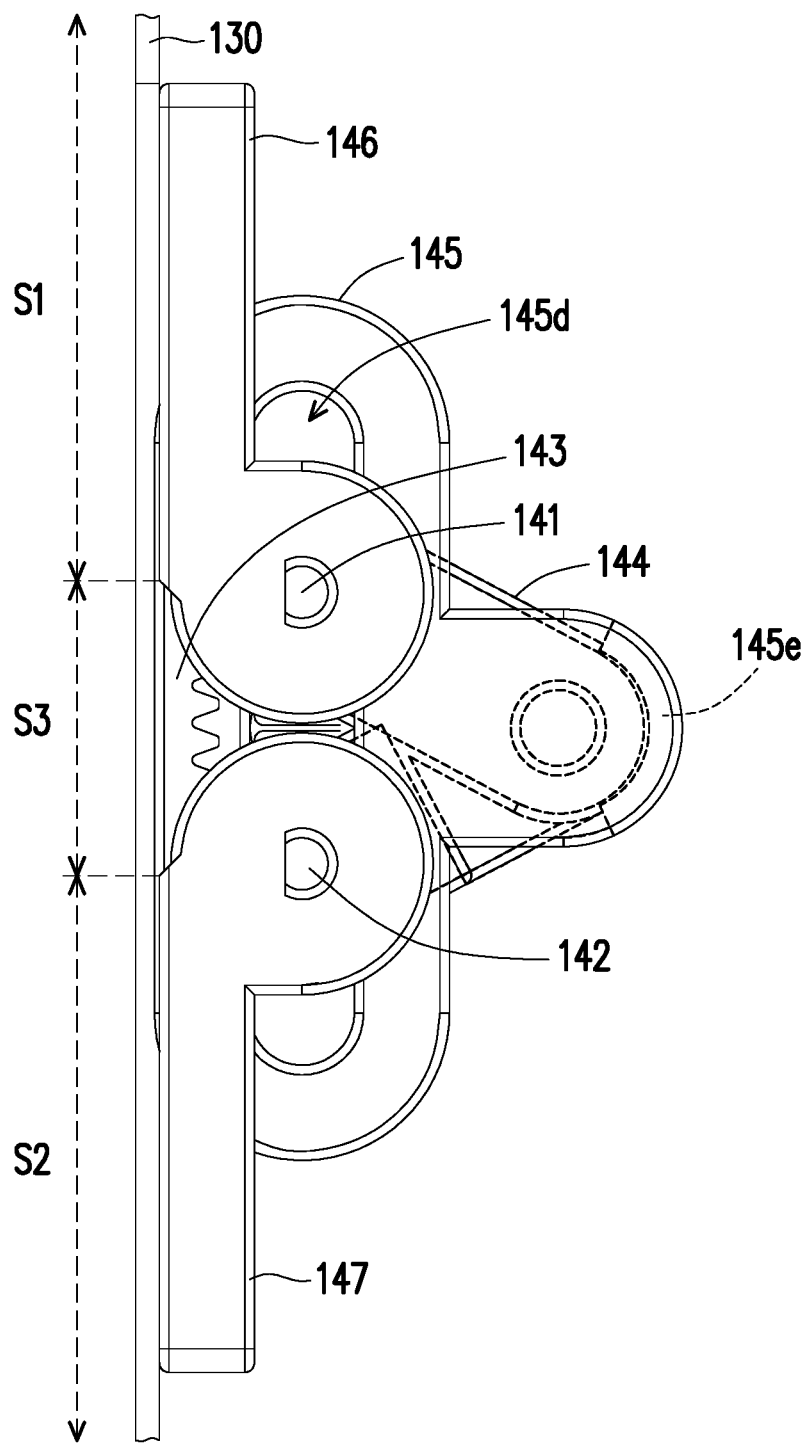

FIG. 3A to FIG. 3C are partial side views of an electronic device in different states. Referring to FIG. 3A to FIG. 3C at the same time, in the embodiment, the switching process from FIG. 3A to FIG. 3C corresponds to the electronic device 100 switching from a folded state (corresponding to FIG. 1A) to an unfolded state of about 180 degrees (corresponding to FIG. 1B). As shown in FIG. 1B, the display surface of the flexible display 130 is divided into a first zone S1, a second zone S2, and a bent zone S3, wherein the first zone S1 is connected to the first hinge 141, the second zone S2 is connected to the second hinge 142, and the bent zone S3 is adjacent between the first zone S1 and the second zone S2. When the flexible display 130 is in a bent state, as shown in FIG. 3A, the bent zone S3 is located between the first hinge 141 and the second hinge 142, and the first zone S1 faces the second zone S2.

Next, when the flexible display 130 is switched from FIG. 3A to FIG. 3B, it represents that the electronic device 100 has been unfolded to an angle. At this time, the curvature of the bent zone S3 has become smaller with respect to FIG. 3A, and thus the first hinge 141 and the second hinge 142 have moved closer to each other from the positions shown in FIG. 3A due to rotation. Here, based on the first track 145c located between the first hinge 141 and the second hinge 142, during the process from FIG. 3A to FIG. 3C, the first hinge 141 and the second hinge 142 relatively move closer to the first track 145c.

Finally, when the flexible display 130 is in the flat state, the first zone S1, the second zone S2, and the bent zone S3 are located on the same plane supported by the first hinge 141, the second hinge 142, and the cradles 146 and 147. At this time, the spacing between the first hinge 141 and the second hinge 142 is at the smallest. In other words, if the hinge module 140 is not configured using the above means and adopts conventional technology, that is, when the hinge spacing is fixed, the increased size of the flexible display 130 due to the switching from the bent state to the flat state during the unfolding process cannot be completely released. As such, when the electronic device 100 is in a 180 degrees unfolded state, the flexible display 130 may produce unpredictable bulging or even falling off at the bent zone S3 instead of the flat state as shown in FIG. 1B. As a result, the flexible display 130 will be creased, causing damage to the structure thereof.

Conversely, when the electronic device 100 is switched from FIG. 3C to FIG. 3A, the first hinge 141 and the second hinge 142 gradually move away during the rotating process so as to form a space between the first hinge and the second hinge to accommodate the bent zone S3. Also, based on the first track 145c between the first hinge 141 and the second hinge 142, during the process from FIG. 3C to FIG. 3A, the first hinge 141 and the second hinge 142 relatively move away from the first track 145c. In this way, the first hinge 141 and the second hinge 142 are relatively far apart to form a spacing sufficient for accommodating the bent zone S3, which is to allow the spacing between the first hinge 141 and the second hinge 142 to be greater than the size of the bent zone S3 in the bent state shown in FIG. 3A, so as to prevent interference between the flexible display 130 and the hinge module 140 generated during the floding process. In other words, once the hinge module 140 is replaced by conventional technology, that is, when the hinge spacing is fixed, the bent zone S3 will face the problem of not being able to be accommodated during the closing process of the electronic device 100, and thus unpredictable bulging or even falling off may occur.

Figure 4A:
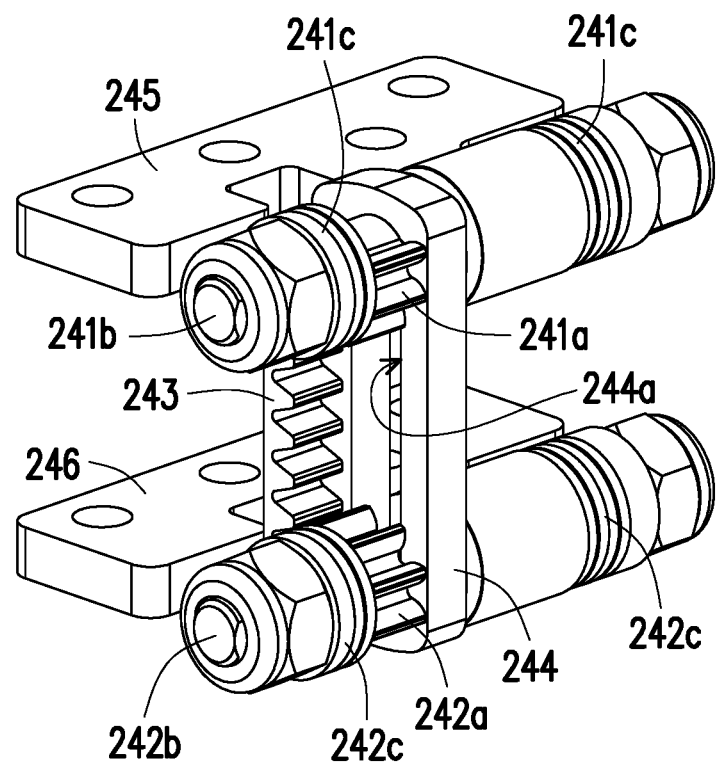
FIG. 4A is a schematic view of a hinge module in accordance with another embodiment of the disclosure.
Figure 4B:
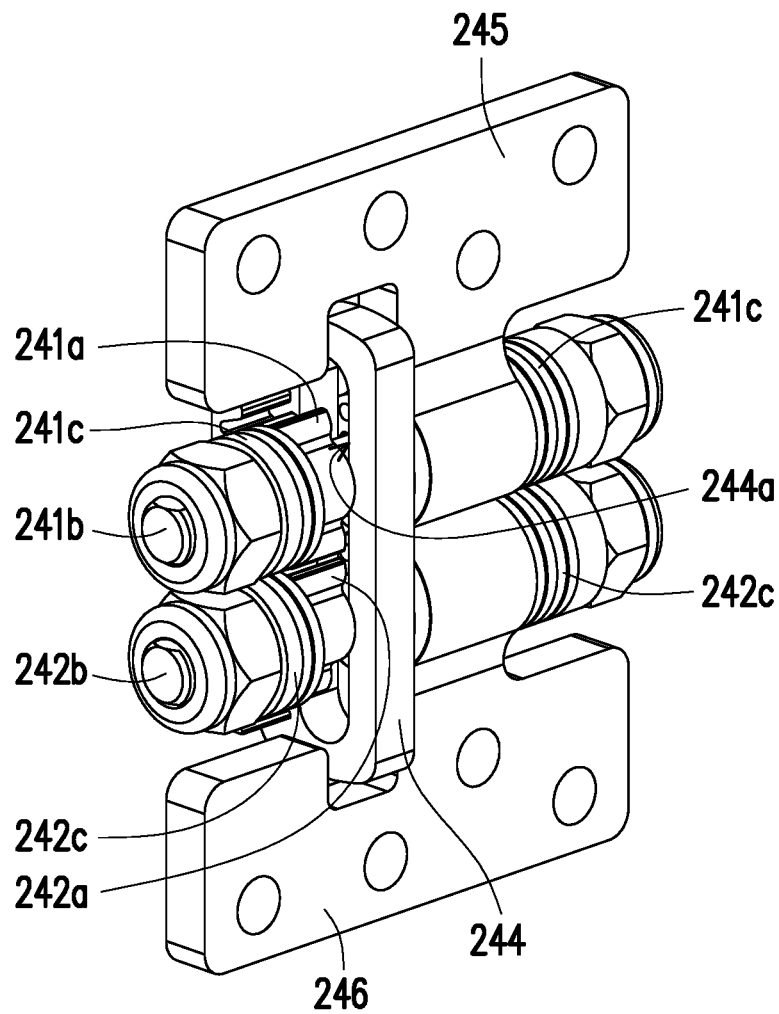
FIG. 4B is a schematic view of the hinge module of FIG. 4A in another state.

FIG. 4A is a schematic view of a hinge module in accordance with another embodiment of the disclosure. FIG. 4B is a schematic view of the hinge module of FIG. 4A in another state. Referring to FIG. 4A and FIG. 4B at the same time, in the embodiment, a hinge module 240 includes a first hinge 241, a second hinge 242, a gear rack 243, a stand 244, and cradles 245 and 246, wherein the gear rack 243 and the stand 244 are an integral structure, and the first hinge 241 includes a first gear 241a, a first shaft portion 241b, and a plurality of first torsion members 241c. The second hinge 242 includes a second gear 242a, a second shaft portion 242b, and a plurality of second torsion members 242c. The first shaft portion 241b passes through the first torsion members 241c and the stand 244, and is assembled to the first gear 241a and the cradle 245, and the second shaft portion 242b passes through the second torsion members 242c and the stand 244, and is assembled to the second gear 242a and the cradle 246. the extending direction of the axis of a second track 244a of the stand 244 and the extending direction of the axis of the gear rack 243 are consistent. Therefore, the present embodiment may also achieve the same effect of the foregoing embodiments via mechanically cooperation between the first gear 241a, the second gear 242a, and the gear rack 243, and also via the extending direction of the second track 244a of the stand 244 being consistent to the extending direction of the gear rack 243.

Based on the above, in the embodiments of the disclosure, the electronic device is configured with the hinge module to correspond to the flexible characteristic of the flexible display, so that the first hinge and the second hinge of the hinge module may move closer to or away from each other during the process of rotation, so as to conform with the deformation trend of the flexible display.

The hinge module allows the first gear and the second gear to be movably coupled to the gear rack together via the first gear and the second gear synchronously rotating with the first hinge and the second hinge respectively, so that a relative displacement exists between the first gear and the second gear during the rotating process. In this way, when the flexible display is in the bent state, the first hinge and the second hinge are away from each other, so that the bending of the flexible display may be accommodated between the first hinge and the second hinge. During the process of the flexible display switching from the bent state to the flat state, the first hinge and the second hinge move closer to each other to cope with the increased size of the bending after being flattened, so that the flexible display may still be stably supported by the first hinge and the second shaft on a plane together when in the flat state.

Although the disclosure has been disclosed in the above embodiments, the embodiments are not intended to limit the disclosure. It will be apparent to persons skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A hinge module, comprising:
a first hinge having a first gear;
a second hinge having a second gear; and
a gear rack, the first gear and the second gear movably coupled to the gear rack, wherein the first hinge moves on the gear rack via rotation of the first gear, the second hinge moves on the gear rack via rotation of the second gear, and the first hinge and the second hinge move closer to or away from each other via rotation,
a linkage connected to the first hinge and the second hinge to synchronously move the first hinge and the second hinge.

2. The hinge module according to claim 1, wherein the first hinge and the first gear rotate about a first axis, the second hinge and the second gear rotate about a second axis, and the first hinge and the second hinge relatively move closer to or away from each other on the gear rack along a third axis, the first axis is parallel to the second axis, and the third axis is orthogonal to the first axis and the second axis.

3. The hinge module according to claim 1, wherein the linkage comprises a first rod, a second rod, and a pivoting shaft, the first rod is connected to the first hinge, the second rod is connected to the second hinge, the pivoting shaft pivots the first rod and the second rod, and the hinge module further comprises a stand, the first hinge and the second hinge respectively passes through the stand, the stand has a first track, and the pivoting shaft is movably coupled to the first track.

4. The hinge module according to claim 3, wherein the first track is between the first hinge and the second hinge, during a process of the first hinge and the second hinge moving closer to or away from each other, the first hinge and the second hinge move closer to the first track or away from the first track.

5. The hinge module according to claim 3, wherein a movement route of the first hinge on the gear rack and a movement route of the second hinge on the gear rack are consistent with each other.

6. The hinge module according to claim 1, further comprising:
a stand having the gear rack and a second track, the first hinge and the second hinge are movably coupled to the second track respectively.

7. The hinge module according to claim 6, wherein the first hinge has a first torsion member, the second hinge has a second torsion member, and the first torsion member and the second torsion member respectively has a protruding portion movably coupled to the second track.

8. The hinge module according to claim 1, further comprising:
a first cradle, the first hinge is assembled to the first cradle and the first cradle is used to connect to a flexible display; and
a second cradle, the second hinge is assembled to the second cradle, and the second cradle is used to connect to the flexible display, wherein when the flexible display is in a bent state, the first cradle and the second cradle are away from each other such that a bending of the flexible display is accommodated between the first hinge and the second hinge, wherein when the flexible display is in a flat state, the first hinge and the second hinge move closer to each other such that the first cradle and the second cradle support the flexible display on a plane.

9. An electronic device, comprising:
a flexible display; and
a hinge module, the flexible display is partially connected to the hinge module so as to be driven by the hinge module to switch between a bent state and a flat state, the hinge module comprising:
a first hinge having a first gear;
a second hinge having a second gear; and
a gear rack, the first gear and the second gear are movably coupled to the gear rack, wherein the first hinge moves on the gear rack via rotation of the first gear, the second hinge moves on the gear rack via rotation of the second gear, and the first hinge and the second hinge move closer to or away from each other via rotation, when the flexible display is in the bent state, the first hinge and the second hinge are away from each other, during the process of the flexible display switching from the bent state to the flat state, the first hinge and the second hinge move closer to each other to support the flexible display on a plane together.

10. The electronic device according to claim 9, wherein a display surface of the flexible display is divided into a first zone, a second zone, and a bent zone, the first zone is connected to the first hinge, the second zone is connected to the second hinge, and the bent zone is adjacent between the first zone and the second zone, when the flexible display is in the bent state, the bent zone is located between the first hinge and the second hinge, and the first zone faces the second zone, when the flexible display is in the flat state, the first zone, the second zone, and the bent zone are located on a same plane.

11. The electronic device according to claim 10, wherein when the flexible display is in the flat state, a spacing between the first hinge and the second hinge is consistent with a size of the bent zone, when the flexible display is in the bent state, a spacing between the first hinge and the second hinge is greater than a size of the bent zone.

12. The electronic device according to claim 9, wherein the first hinge and the first gear rotate about a first axis, the second hinge and the second gear rotate about the second axis, and the first hinge and the second hinge relatively move closer to or away from each other on the gear rack along a third axis, the first axis is parallel to the second axis, and the third axis is orthogonal to the first axis and the second axis.

13. The electronic device according to claim 9, wherein the hinge module further comprises:
a linkage connected to the first hinge and the second hinge to synchronously move the first hinge and the second hinge.

14. The electronic device according to claim 13, wherein the linkage comprises a first rod, a second rod, and a pivoting shaft, the first rod is connected to the first hinge, the second rod is connected to the second hinge, and the pivoting shaft pivots the first rod and the second rod, and the hinge module further comprises a stand, the first hinge and the second hinge respectively passes through the stand, the stand has a first track, and the pivoting shaft is movably coupled to the first track.

15. The electronic device according to claim 14, wherein the first track is between the first hinge and the second hinge, during a process of the first hinge and the second hinge moving closer to or away from each other, the first hinge and the second hinge move closer to the first track or away from the first track.

16. The electronic device according to claim 14, wherein a movement route of the first hinge on the gear rack and a movement route of the second hinge on the gear rack are consistent with each other.

17. The electronic device according to claim 9, wherein the hinge module further comprises:
a stand having the gear rack and a second track, the first hinge and the second hinge are movably coupled to the second track respectively.

18. The electronic device according to claim 17, wherein the first hinge has a first torsion member, the second hinge has a second torsion member, and the first torsion member and the second torsion member respectively has a protruding portion movably coupled to the second track.

19. The electronic device according to claim 9, wherein the hinge module further comprises:

a first cradle, the first hinge is assembled to the first cradle and the first cradle is used to connect to the flexible display; and a second cradle, the second hinge is assembled to the second cradle and the second cradle is used to connect to the flexible display, wherein when the flexible display is in the bent state, the first cradle and the second cradle are away from each other, wherein when the flexible display is in the flat state, the first cradle and the second cradle support the flexible display on the plane.

* * * * *